United States Patent
Yang et al.

(10) Patent No.: US 10,624,203 B2
(45) Date of Patent: Apr. 14, 2020

(54) OPTICAL MODULE

(71) Applicants: HISENSE BROADBAND MULTIMEDIA TECHNOLOGIES CO., LTD., Qingdao (CN); HISENSE USA CORPORATION, Suwanee, GA (US); HISENSE INTERNATIONAL CO., LTD., Qingdao (CN)

(72) Inventors: Sigeng Yang, Qingdao (CN); Shijian Ben, Qingdao (CN); Jingsheng Xia, Qingdao (CN); Yongliang Huang, Qingdao (CN)

(73) Assignees: Hisense Broadband Multimedia Technologies Co., Ltd., Qingdao (CN); Hisense USA Corporation, Suwanee, GA (US); Hisense International Co., Ltd., Qingdao (CN)

( * ) Notice: Subject to any disclaimer, the term of this patent is extended or adjusted under 35 U.S.C. 154(b) by 0 days.

(21) Appl. No.: 16/029,071

(22) Filed: Jul. 6, 2018

(65) Prior Publication Data
US 2018/0317315 A1 Nov. 1, 2018

Related U.S. Application Data (63) Continuation of application No. 15/269,179, filed on Sep. 19, 2016.

(30) Foreign Application Priority Data

Jan. 19, 2016 (CN) .......................... 2016 1 0035311

(51) Int. Cl.
*H05K 1/02* (2006.01)
*H05K 3/32* (2006.01)
(Continued)

(52) U.S. Cl.
CPC ........... *H05K 1/0216* (2013.01); *G02B 6/428* (2013.01); *H05K 1/111* (2013.01); *H05K 1/181* (2013.01);
(Continued)

(58) Field of Classification Search
CPC ........ H05K 1/111; H05K 1/181; H05K 1/182; H05K 1/0216–0221
See application file for complete search history.

(56) References Cited

U.S. PATENT DOCUMENTS

| 5,723,906 A | 3/1998 | Rush |
| 5,898,213 A | 4/1999 | Torres et al. |

(Continued)

FOREIGN PATENT DOCUMENTS

| CN | 1661815 A | 8/2005 |
| CN | 201260170 Y | 6/2009 |
| JP | H0878458 A | 3/1996 |

OTHER PUBLICATIONS

Office Action from corresponding Chinese Application No. 201610035311.0 dated Jun. 1, 2018 (6 pages).

*Primary Examiner* — Hoa C Nguyen
(74) *Attorney, Agent, or Firm* — Brinks Gilson & Lione (57) ABSTRACT

The disclosure discloses an optical module, and relates to the field of optic fiber communications. A circuit according to an embodiment of the disclosure includes: a chip, which includes at least one wiring side, and on which there are arranged first signal interface pads arranged parallel to the wiring side; a circuit board on which there are arranged a number of second signal interface pads corresponding to the first signal interface pads, wherein at least two of the distances between the respective second signal interface pads and the wiring side are different from each other; and (Continued)

signal wires configured to connect the corresponding first signal interface pads and second signal interface pads.

9 Claims, 5 Drawing Sheets

(51) Int. Cl.
    *G02B 6/42*     (2006.01)
    *H05K 1/11*     (2006.01)
    *H05K 1/18*     (2006.01)

(52) U.S. Cl.
    CPC ........... *H05K 3/328* (2013.01); *G02B 6/4279* (2013.01); *H05K 1/0219* (2013.01); *H05K 2201/09709* (2013.01); *H05K 2201/10121* (2013.01); *H05K 2203/049* (2013.01); *Y02P 70/611* (2015.11)

(56) References Cited

U.S. PATENT DOCUMENTS

| | | | |
|---|---|---|---|
| 6,538,336 B1 | 3/2003 | Secker et al. | |
| 6,767,252 B2 | 7/2004 | McGrath et al. | |
| 7,448,884 B2 * | 11/2008 | Kato | H01R 13/658 |
| | | | 439/108 |
| 9,006,910 B2 * | 4/2015 | Oikawa | H01L 23/66 |
| | | | 257/786 |
| 2002/0163018 A1 * | 11/2002 | Kamiya | H01L 23/66 |
| | | | 257/208 |
| 2006/0192300 A1 * | 8/2006 | Appel | H01L 23/66 |
| | | | 257/784 |
| 2011/0180940 A1 | 7/2011 | Oikawa | |
| 2011/0198742 A1 * | 8/2011 | Danno | H01L 21/561 |
| | | | 257/676 |
| 2014/0312474 A1 * | 10/2014 | Joshi | H01L 24/49 |
| | | | 257/666 |

* cited by examiner

OPTICAL MODULE

CROSS-REFERENCE TO RELATED APPLICATIONS

This application is a continuation of U.S. patent application Ser. No. 15/269,179 filed Sep. 19, 2016, which claims the benefit and priority of Chinese Patent Application No. 201610035311.0, filed Jan. 19, 2016. The entire disclosures of the above applications are incorporated herein by reference.

FIELD

The present disclosure relates to the field of optic fiber communications, and particularly to an optical module.

BACKGROUND

This section provides background information related to the present disclosure which is not necessarily prior art.

An optical module is required to support transmission of a signal in the field of optic fiber communications. In the optical module (particularly an optic-electric transceiver module), a chip tends to be arranged on a circuit board, and particularly a signal interface pad on the chip can be wired with a signal interface pad on the circuit board.

SUMMARY

This section provides a general summary of the disclosure, and is not a comprehensive disclosure of its full scope or all of its features.

Some embodiments of the disclosure provide an optical module including:

a chip, which includes at least one wiring side, and is provided with first signal interface pads arranged parallel to the wiring side;

a circuit board which is provided with a plurality of second signal interface pads corresponding to the first signal interface pads, wherein at least two of the distances between the respective second signal interface pads and the wiring side are different from each other; and signal wires configured to connect the corresponding first signal interface pads and second signal interface pads.

Some embodiments of the disclosure further provide an optical module including a chip, a circuit board, and signal wires, wherein:

the chip is located above the circuit board;

the chip includes at least one wiring side, and size of the wiring side is no more than size of the circuit board, and a plurality of first signal interface pads which do not coincide with each other are arranged on the chip;

a plurality of second signal interface pads corresponding to the first signal interface pads are arranged on the circuit board, the second signal interface pads do not coincide with each other, and projections of centers of the second signal interface pads onto an extending line of a perpendicular line perpendicular to the wiring side are distributed at N positions, wherein N is a positive integer more than 1; and the signal wires are configured to connect the corresponding first signal interface pads and second signal interface pads.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Example embodiments will now be described more fully with reference to the accompanying drawings.

For the sake of a clear description of the technical solutions according to the embodiments of the disclosure, the terms "first", "second", etc., are used to distinguish identical or like elements with substantially the same functions and roles in the embodiments of the disclosure, but those skilled in the art can appreciate that the terms "first", "second", etc., are not intended to limit the number of elements, and an order in which they are performed.

Figure 1:
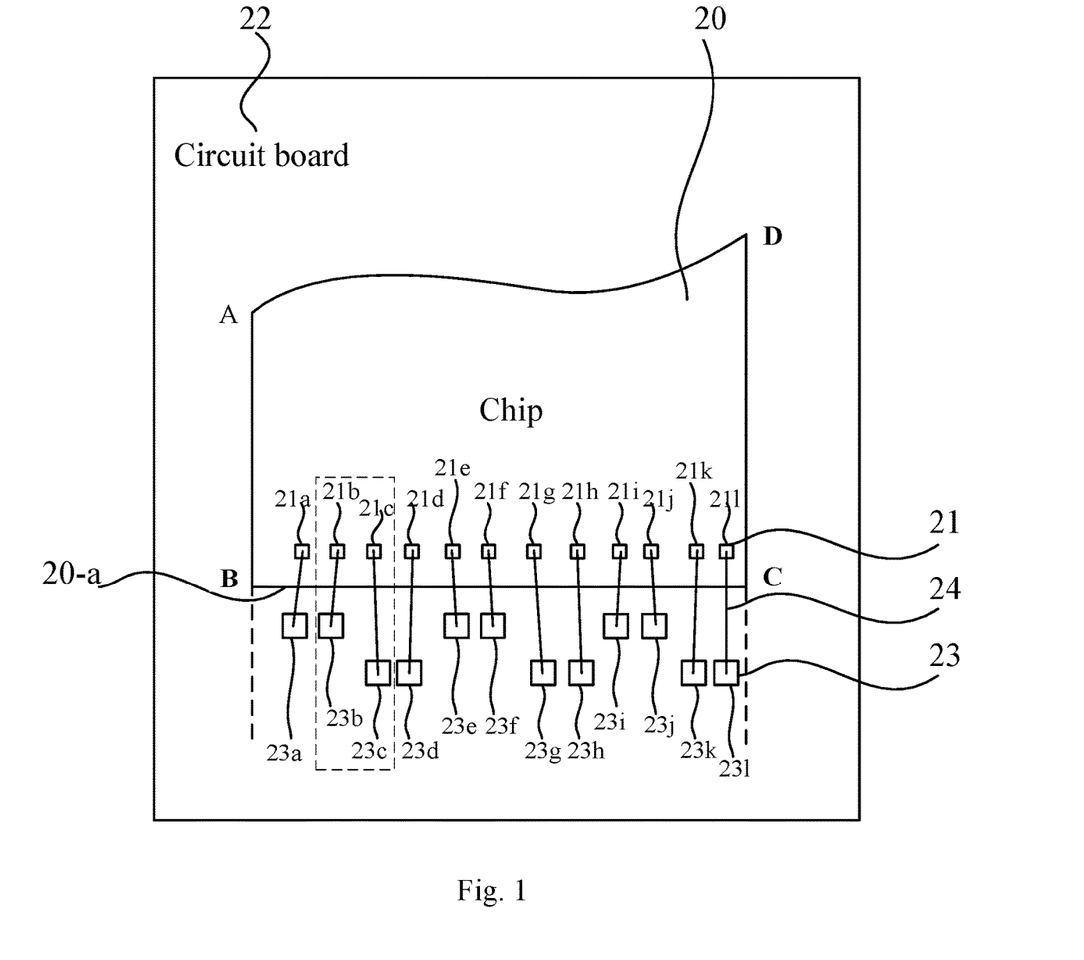
FIG. 1 is a schematic diagram of an optical module according to some embodiments of the disclosure.

Some embodiments of the disclosure provide an optical module as illustrated in FIG. 1, which includes: a chip 20 which includes at least one wiring side, and on which there are arranged a row of first signal interface pads 21 arranged parallel to a first wiring side 20-*a*; a circuit board 22 on which there are arranged a number of second signal interface pads 23 corresponding to the row of first signal interface pads 21, where at least two of the distances between the respective second signal interface pads 23 and the first wiring side 20-*a* are different from each other; and wiring, i.e., signal wires 24, configured to connect the first signal interface pads 21 and the second signal interface pads 23 corresponding thereto in a one-to-one manner.

In the optical module, such as an optic-electric transceiver module, the chip 20 tends to be arranged on the circuit board 22, where the chip 20 can be a bare chip (which refers to a product form of a semiconductor element before it is packaged while being fabricated), or can be a packed chip, the shape of which is typically a rectangle. It shall be noted that the chip 20 in some embodiments of the disclosure refers to a chip which is fixed on the bottom thereof to a circuit board, and arranged with pads on the top thereof, and which can be wired with pads on the circuit board. A row of pads can be arranged on some side of the upper surface of the rectangular chip (the surface thereof away from the circuit) parallel to the side, or a row of pads can be arranged respectively on each of the sides of the upper surface of the chip parallel to the corresponding side. The shape of the chip 20, and the side or sides on which the pads are arranged have been illustrated in FIG. 1 merely by way of an example, and the embodiments of the disclosure will not be limited thereto.

The wiring side refers to the side across which the pads are wired on the chip. Since there is a row of pads arranged on the lower side of the upper surface of the rectangular chip in FIG. 1, the pads correspond to the first wiring side 20-a. Of course, if a row of pads are arranged respectively on each of the sides of the chip, then each row of pads will correspond to a wiring side (i.e., the wiring side across which the pads are wired). As illustrated in FIG. 1, if a row of pads are also arranged on the left side of the chip, then a wiring side corresponding to the row of pads will be the AB side; and alike a wiring side may also be the CD side.

The wiring structure across the first wiring side 20-a can be applicable to the wiring structure across each wiring side.

If the first signal interface pads 21 are arranged in a row parallel to the first wiring side 20-a, then the centers of the row of first signal interface pads 21 arranged on the chip 20 will lie on the same straight line parallel to the first wiring side 20-a. It shall be noted that all of the sizes and the shapes of the pads may not be uniform. However the position where a pad is arranged is determined by a reference point (or referred to as a positional reference point), that is, the pad needs to be arranged at the position where the reference point is located, and the center of a first signal interface pad 21 here refers to a reference point determining the position of the pad.

Moreover a number of second signal interface pads 23 corresponding to a row of first signal interface pads 21 are arranged on the circuit board 22. Each of the second signal interface pads 23 is wired with a specific one of the first signal interface pads 21 instead of being wired with more than one of the first signal interface pads 21. Alike each of the first signal interface pads 21 will not be wired with more than one of the second signal interface pads 23. In order to avoid the wires from intersecting with each other, each of the second signal interface pads 23 corresponds to one of the first signal interface pads 21, which is positioned in the same order as the second signal interface pad 23. As illustrated in FIG. 1, both the second signal interface pad 23a and the first signal interface pad 21a are arranged respectively as the first signal interface pads starting from the left side, so the second signal interface pad 23a corresponds to the first signal interface pad 21a; and alike the second signal interface pad 23b corresponds to the first signal interface pad 21b, and the second signal interface pad 23c corresponds to the first signal interface pad 21c, and so on.

Figure 3:
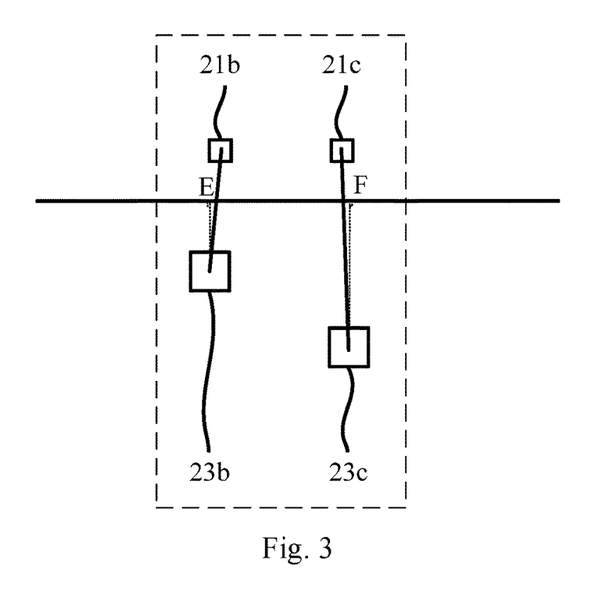
FIG. 3 is a schematic diagram of partially enlarged components in a dotted box in FIG. 2 according to some embodiments of the disclosure.

The protections of the centers of the respective second signal interface pads 23 onto the first wiring side 20-a do not coincide with each other. The center of a second signal interface pad 23 here also refers to a reference point determining the position of the pad. As illustrated in FIG. 3, the centers of the second signal interface pad 23b and the second signal interface pad 23c are projected respectively onto the first wiring side 20-a, and their projections E and F do not coincide with each other, so that there will be some distance by which the signal wires on any two second signal interface pads 23 are spaced to thereby avoid the different signal wires from coming into contact with each other.

Figure 2:
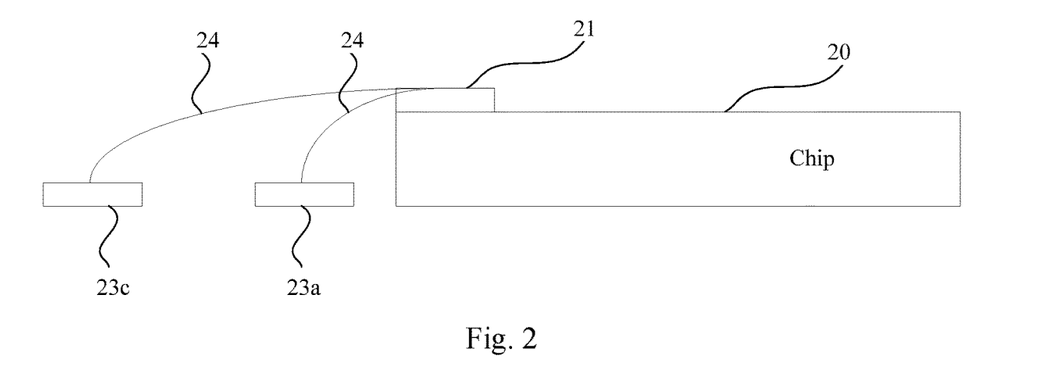
FIG. 2 is a side view of an optical module according to some embodiments of the disclosure.

Moreover at least two of the distances between the respective second signal interface pads 23 and the first wiring side 20-a are different from each other. The distance between a second signal interface pad 23 and the first wiring side 20-a here refers to the distance between the center of the second signal interface pad 23, i.e., the reference point determining the position of the pad, and the first wiring side 20-a. As illustrated in FIG. 1, there are longer distances between the second signal interface pads 23a and 23b, and the first wiring side 20-a, and short distances between the second signal interface pads 23c and 23d, and the first wiring side 20-a, so that the signal wire connecting the second signal interface pad with the first signal interface pad at a longer distance from the second is less steep, and the signal wire connecting the second signal interface pad with the first signal interface pad at a shorter distance from the second is more steep, that is, these two signal wires are different in steepness, so that these two signal wires will not coincide with each other from the perspective of their sides to thereby lower in effect crosstalk between the signal wires. As illustrated in FIG. 2, as can be apparent, there is an angle between the wires on the second signal interface pad 23a and the second signal interface pad 23c, and there will be no mutual inductance between the signal wires with an angle between them, thus lowering in effect crosstalk between the signal wires.

The signal wires configured to connect the corresponding first signal interface pads 21 and second signal interface pads 23 can be gold wires.

The respective second signal interface pads 23 are arranged in two rows on the circuit board 22, and each of the rows is parallel to the first wiring side 20-a. As illustrated in FIG. 1, there are twelve second signal interface pads 23 in total, which are arranged in two rows on the circuit board 21 with six second signal interface pads in a row, where there are a shorter distance between one row and the first wiring side 20-a, and a longer distance between the other row and the first wiring side 20-a, so that the second signal interface pads 23 are alternately arranged in the front and back rows. In the meanwhile, the centers of the respective second signal interface pads 23 in each row lie on the same straight line parallel to the first wiring side 20-a. The center of a second signal interface pad 23 here also refers to a reference point determining the position of the pad. The number of pads in a group of pads on the circuit can be set as needed in reality, and this embodiment will not be limited to any particular number of pads.

The respective second signal interface pads are grouped into N consecutive groups, where N is more than or equal to 3. The numbers of pads in the respective groups here may or may not be the same, where the second signal interface pads 23 in the odd groups are located in the same row, and the second signal interface pads 23 in the even groups are located in the other row. As illustrated in FIG. 1, there are twelve second signal interface pads 23 in total, which are arranged in six groups with 2 second signal interface pads in a row, where the second signal interface pads 23 in the first group, the third group, and the fifth group starting from the left side are located in a row at a shorter distance with the first wiring side 20-a, and the second signal interface pads 23 in the second group, the fourth group, and the sixth group starting from the left side are located in a row at a longer distance with the first wiring side 20-a.

Here the number of second signal interface pads 23 in each group is the same. There are two second signal interface pads 23 in each group. As illustrated in FIG. 1, there are second signal interface pads 23a and 23b in a group, and second signal interface pads 23c and 23d in a group, so that there are two second signal interface pads in each group. Since two second signal interface pads in each group are at the same distance from the first wiring side 20-a, the lengths of two signal wires connecting the pads in the same group are the same, and these two signal wires are parallel to each other, where these two signal wires can be a differential pair over which differential signals are transmitted. Since there is a difference in phrase of 180 degrees between the differential signals, a common-mode signal can be cancelled over these two signal wires to thereby enhance in effect interference robustness of the differential pair, and alleviate their outward energy radiation. Particularly the signal wire connecting the first signal interface pads 21a with the second signal interface pad 23a, and the signal wire connecting the first signal interface pads 21b with the second signal interface pad 23b constitute a differential pair of wiring in FIG. 1.

The respective second signal interface pads 23 lie within two boundary lines which are extending lines of the adjacent sides of the first wiring side 20-a. As illustrated in FIG. 1, if the first wiring side is the BC side, then the two boundary lines will be the AB side and the DC side respectively of the chip 20, and their extending lines will be the dotted lines as illustrated. If a part of the second signal interface pads 23 do not lie within the two boundary lines, then the signal wires 24 between these second signal interface pads 23 and their corresponding first signal interface pads 21 will be longer in wiring, and since there is more crosstalk corresponding to longer signal wires, crosstalk between the signal wires can be further alleviated in the solution according to this embodiment.

Figure 4:
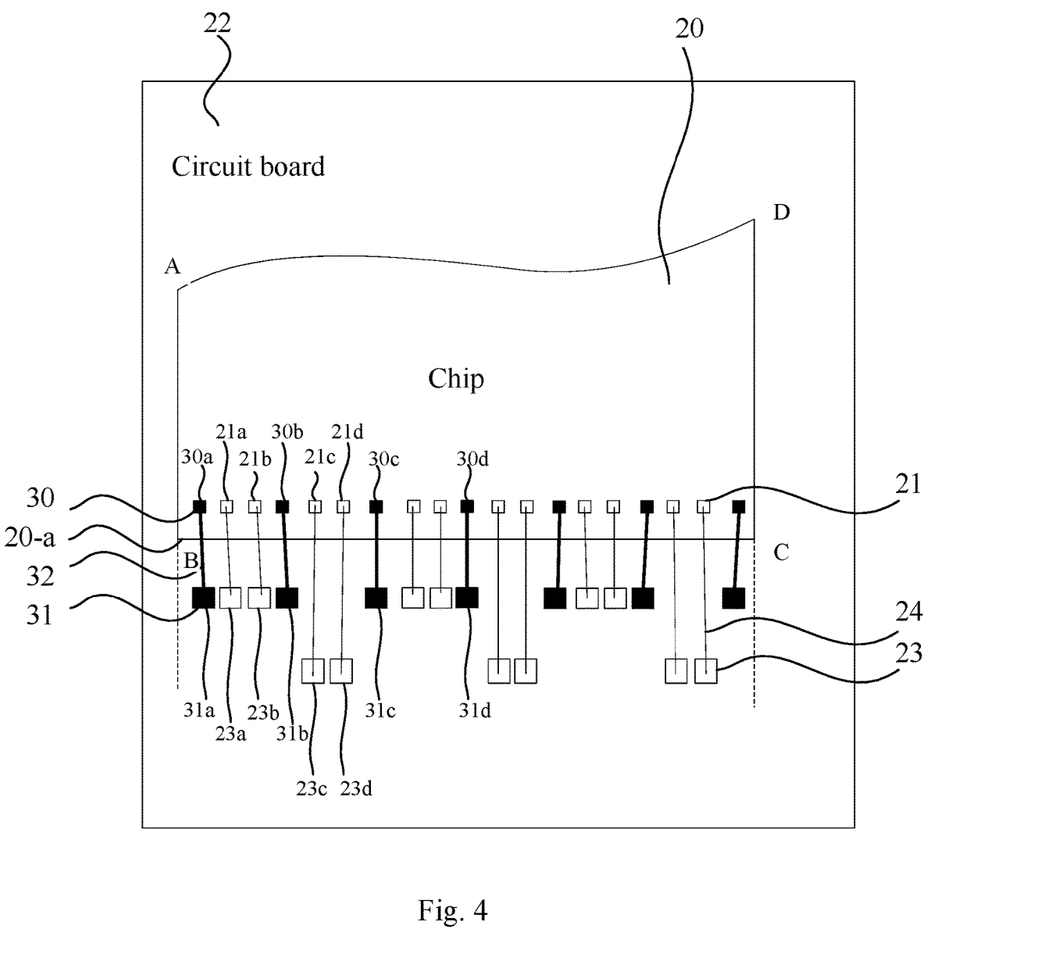
FIG. 4 is a schematic diagram of another optical module according to some embodiments of the disclosure.

In order to further alleviate crosstalk between the signal wires, ground pads are further added in some embodiments of the disclosure. As illustrated in FIG. 4, first ground pads 30 located in the same row as the first signal interface pads 21 are further arranged on the chip 20; second ground pads 31 corresponding to the first ground pads 30 are further arranged on the circuit board 22; and ground wires 32 are configured to connect the corresponding first ground pads 30 and second ground pads 31.

The ground pads are, that is, ground isolation is, added between the signal wires so that a high-speed signal can be provided with a reflowing path to thereby alleviate energy radiation, and crosstalk between the signal wires, where the first ground pads 30 can be located in the same row as the first signal interface pads 21 in a simple process, and a larger space can be reserved for wiring in the chip.

The second ground pads 31 corresponding to the first ground pads 30 are arranged on the circuit board 22. Each of the second ground pads 31 is wired with a specific one of the first ground pads 30 instead of being wired with more than one of the first ground pads 30, and alike each of the first ground pads 30 will not be wired with more than one of the second ground pads 31. In order to avoid the wires from intersecting with each other, each of the second ground pads 31 corresponds to one of the first ground pads 30, which is positioned in the same order as the second ground pad 31. As illustrated in FIG. 4, both the second ground pad 31a and the first ground pad 30a are arranged respectively as the first ground pad starting from the left side, so the second ground pad 31a corresponds to the first ground pad 30a, the second ground pad 31b corresponds to the first ground pad 30b, the second ground pad 31c corresponds to the first ground pad 30c, and so on.

The ground wires 32 configured to connect the corresponding first ground pads 30 and second ground pads 31 can be gold wires.

The chip 20 includes at least two first ground pads 30, and every two adjacent first ground pads 30 are spaced by at least one first signal interface pad 21. A number of ground wires can be arranged to provide a high-speed signal with as many shorter reflowing paths as possible to thereby alleviate energy radiation, and crosstalk between the signal wires.

Every two adjacent first ground pads are spaced by two first signal interface pads. The distances between two second signal interface pads corresponding to these two first signal interface pads, and the first wiring side 20-a are the same so that signal wires connecting these two first signal interface pads can be a differential pair for transmitting differential signals. Generally if there are M (M≥2) differential pairs, then at least one ground wire will be arranged between two adjacent differential pairs so that a signal wire in each differential pair, which is closer to the ground wire, and the ground wire constitute a reflowing path. For example, if there are M (M≥2) differential pairs, then there will be at least (M−1) ground wires arranged. If there are M (M≥2) differential pairs, then there will be at least (M+1) ground wires arranged so that each signal wire in a differential pair, and a ground wire the closest thereto constitute a reflowing path. As illustrated in FIG. 4, there are seven first ground pads 30 arranged on the chip, where the first ground pad 30a and the first ground pad 30b are spaced by the two first signal interface pads 21a and 21b, and the first ground pad 30c and the first ground pad 30d are spaced by the two first signal interface pads 21c and 21d, so that the signal wire connecting the first signal interface pad 21a with the second signal interface pad 23a, and the signal wire connecting the first signal interface pad 21b with the second signal interface pad 23b can be a differential pair, and further differential signals transmitted over each differential pair can be provided with the shortest reflowing path. Particularly the signal wire connecting the first signal interface pad 21a with the second signal interface pad 23a, and the signal wire connecting the first ground pad 30a with the second ground pad 31a constitute the shortest reflowing path, the signal wire connecting the first signal interface pad 21b with the second signal interface pad 23b, and the signal wire connecting the first ground pad 30b with the second ground pad 31b constitute the shortest reflowing path, the signal wire connecting the first signal interface pad 21c with the second signal interface pad 23c, and the signal wire connecting the first ground pad 30b with the second ground pad 31b constitute the shortest reflowing path, and so on.

The distance between the second ground pads 31 and the first wiring side 20-a is equal to the shortest one of the distances between the respective second signal interface pads 23 and the first wiring side 20-a. As illustrated in FIG. 4, seven second ground pads 31 are arranged on the circuit board 22, and each of the second ground pads 31 is arranged in the same row as the second signal interface pad 23 at the shortest distance from the first wiring side 20-a so that the length of the ground wire can be made as short as possible, so a signal coupled to the ground wire can be transmitted to the ground of the entire circuit board over the shortest path to thereby enhance the shielding effect.

The respective second ground pads 31 lie within two boundary lines which are extending lines of the adjacent sides of the first wiring side 20-a. As illustrated in FIG. 4, if the first wiring side is the BC side, then the two boundary lines will be the AB side and the DC side respectively of the chip 20, and their extending lines will be the dotted lines as illustrated. If a part of the second ground pads 31 do not lie within the two boundary lines, then the signal wires 32 between these second ground pads 31 and their corresponding first ground pads 30 will be longer in wiring, and since there is more crosstalk corresponding to longer signal wires, crosstalk between the signal wires can be further alleviated in the solution according to this embodiment.

In the circuit in the optical module according to some embodiments of the disclosure, the first ground pads are additionally arranged on the wiring side of the chip, and the second ground pads are additionally arranged on the circuit board, so that a high-speed signal can be provided with a reflowing path to thereby alleviate energy radiation so as to alleviate in effect crosstalk between the signal wires. Moreover the lengths of the ground wires between the first ground pads and the second ground pads are shorter so that a signal coupled to the ground lines can be transmitted to the ground of the entire circuit board over the shortest path to thereby enhance the shielding effect so as to further alleviate crosstalk between the signal wires, and guarantee data communication, and transmission of interaction signals.

Figure 5:
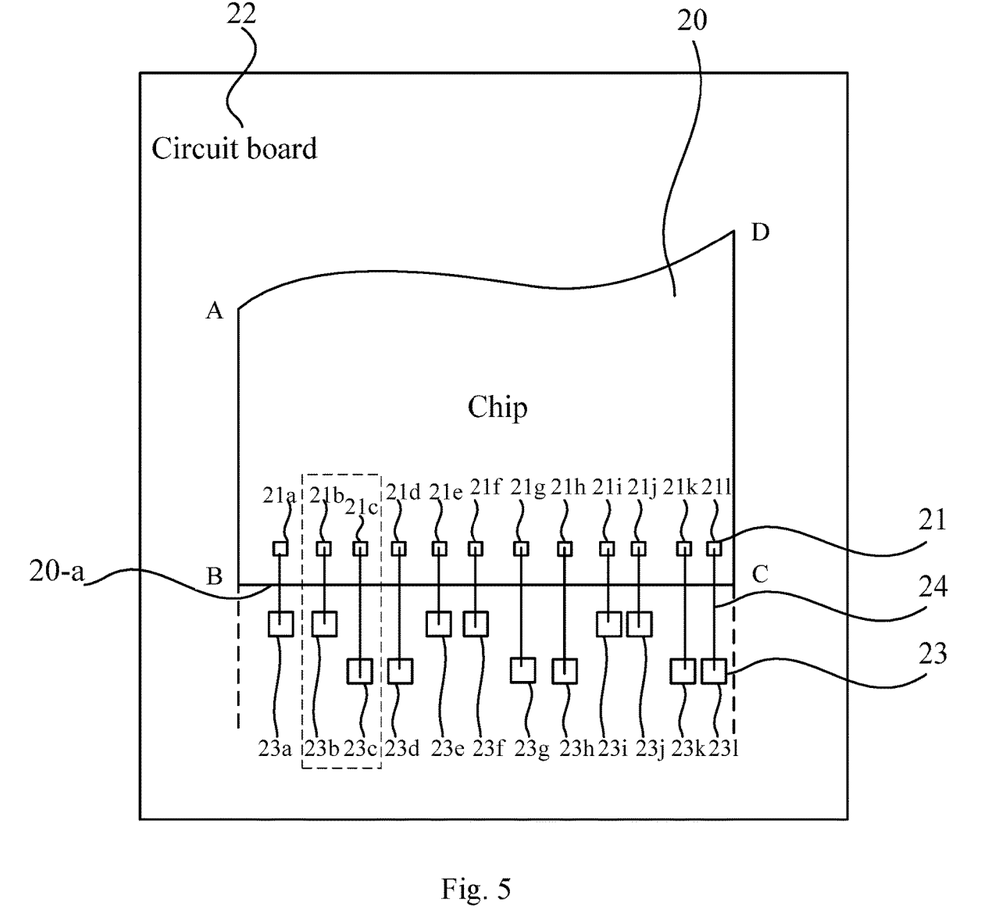
FIG. 5 is a schematic diagram of another optical module according to some embodiments of the disclosure.

Some embodiments of the disclosure further provide an optical module. In these embodiments, the same reference numerals represent identical or like features in the embodiments above. As illustrated in FIG. 5, the optical module includes a chip 20, a circuit board 22, and signal wires 24, where the chip 20 is located above the circuit board 22. The size of a wiring side 20a of the chip 20 is no more than the size of the circuit board 22, and a number of first signal interface pads 21 which do not coincide with each other are arranged on the chip.

Figure 6:
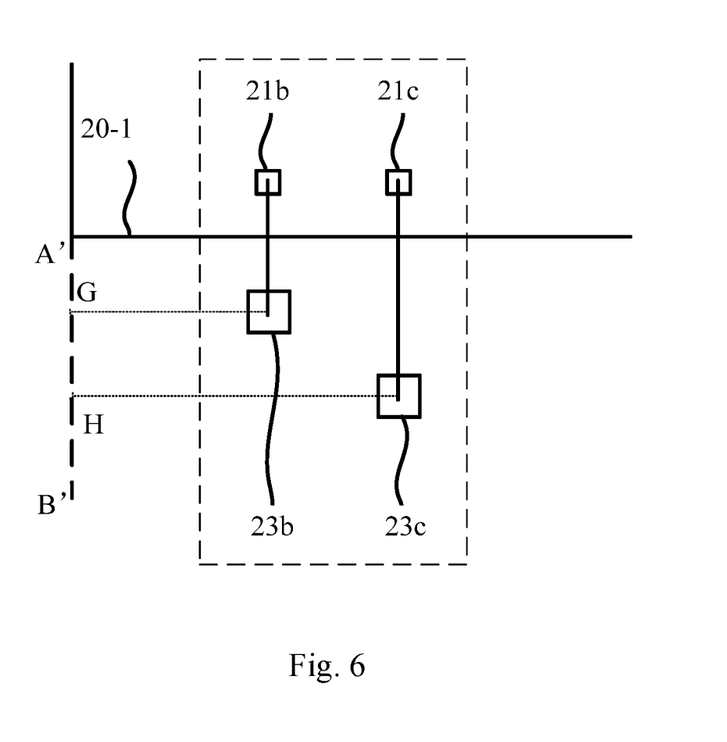
FIG. 6 is a schematic diagram of partially enlarged components in a dotted box in FIG. 5 according to some embodiments of the disclosure.

A number of second signal interface pads 23 corresponding to the first signal interface pads 21 are arranged on the circuit board 22. The second signal interface pads 23 do not coincide with each other, and moreover as illustrated in FIG. 6, the projections of the centers of the second signal interface pads 23 onto an extending line A'B' perpendicular to the wiring side 20-1 across, which the signal wires 24 on the second signal interface pads 23 run, are distributed at N positions, where N is a positive integer more than 1. For example, the protections G and H the centers of the signal interface pads 23b and 23c onto the extending line A'B' perpendicular to the wiring side 20-1 are distributed at two positions on the extending line A'B'. Moreover at least two of the distances between the respective second signal interface pads 23, and the wiring side 20-a across which the signal wires 24 thereon run are different from each other; and The signal wires 24 are configured to connect the corresponding first signal interface pads 21 and second signal interface pads 23.

The second signal interface pads 23 arranged on the circuit board 22 corresponding to the first signal interface pads 21 do not coincide with each other.

The first signal interface pads 21 are arranged in a row parallel to the wiring side 20-a across which the signal wires 24 thereon run. The projections of the signal wires 24 onto the chip 20 are perpendicular to the wiring side 20-a across which they run.

The projections of the centers of the second signal interface pads 23 onto the wiring side 20-a across which the signal wires 24 on the second signal interface pads 23 run do not coincide with each other.

The second signal interface pads 23 are arranged on the circuit board 22 in two rows, and each of the rows is parallel to the wiring side 20-a across which the signal wires 24 thereon run. Moreover the respective second signal interface pads 23 can be further grouped into N consecutive groups, where N is more than or equal to 3. The second signal interface pads 23 in the odd groups are located in the same row, and the second signal interface pads 23 in the even groups are located in the other row.

The respective second signal interface pads 23 lie within two boundary lines which are extending lines of the adjacent sides of the wiring side 20-a across which the signal wires on the second signal interface pads 23 run.

First ground pads 30 located in the same row as the first signal interface pads 21 are further arranged on the chip 20; and second ground pads 31 corresponding to the first ground pads 30 are further arranged on the circuit board 22.

The optical module further includes ground wires 32 configured to connect the corresponding first ground pads 30 and second ground pads 31.

At least two first ground pads 30 are arranged on the chip 20. Every two adjacent first ground pads 30 can be spaced by at least one first signal interface pad 21 or by two first signal interface pads 21.

The distance between the second ground pads 31 and the wiring side 20-a, across which the ground wires 32 on the second ground pads 31 run, is equal to the shortest one of the distances between the respective second signal interface pads 23 and the wiring side 20-a across which the signal wires 24 on the second signal interface pads 23 run.

The respective second ground pads 31 lie within two boundary lines which are extending lines of the adjacent sides of the wiring side 20-a across which the ground wires 32 on the second ground pads 31 run.

Some embodiments of the disclosure further provide an optical module including the circuit above. The optical module can be an optic-electric transceiver module.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. An optical module, comprising:
   a chip, having a plurality of first signal interface pads arranged in a line which is parallel to a first side of the chip;
   a circuit board having at least a first row and a second row of a plurality of second signal interface pads, wherein the chip is disposed on the circuit board, wherein the first row and second row are arranged substantially in parallel with the first side of the chip, and wherein the first row is of a shorter distance to the first side of the chip than the second row;
   a plurality of signal wires connected between the plurality of first signal interface pads and the plurality of second signal interface pads;
   first ground pads located in the same row as the plurality of first signal interface pads and arranged on the chip; and
   second ground pads corresponding to the first ground pads and arranged on the circuit board in substantially a same row as the first row of the plurality of second signal interface pads, wherein at least one pair of the first row of the plurality of second signal interface pads are bracketed by at least one second ground pad on each side,
   wherein no accompanying ground pads are located adjacent to and in a same row as the second row of the plurality of signal interface pads, and within lines extended from edges of the chip perpendicular to the first side of the chip;

wherein the first ground pads and second ground pads are connected by ground wires; and wherein the ground wires substantially extend to and shield electromagnetic interference of full length of adjacent pairs of the signal wires connecting the first signal interface pads and the first row of the plurality of second signal interface pads, and extend to and shield electromagnetic interference of partial length of adjacent pairs of the signal wires connecting the first signal interface pads and the second row of the plurality of second signal interface pads.

2. The optical module of claim 1, wherein at least one pair of the first signal interface pads of the chip are bracketed by at least one first ground pad on each side.

3. The optical module of claim 1, wherein the first row of the plurality of second signal interface pads comprises at least two pairs of differential signal interface pads and each pair of the at least two pairs of differential signal pads are bracketed by at least one second ground pad on each side.

4. The optical module of claim 1, wherein:

the first row of the plurality of second signal interface pads and the second ground pads comprise a first of the second ground pads followed by a first pair of differential signal interface pads followed by a second of the second ground pads and a third of the second ground pads followed by a second pair of differential signal interface pads followed by a fourth of the second ground pads and a fifth of the second ground pads; and the second row of the plurality of second signal interface pads comprise:

a third pair of differential signal interface pads located substantially between the second of the second ground pads and the third of the second ground pads in a direction parallel to the first side of the chip; and a fourth pair of differential signal interface pads located substantially between the fourth of the second ground pads and the fifth of the second ground pads; and the plurality of second signal interface pads and the second ground pads are wired consecutively to the plurality of first signal interface pads and the first ground pads in a spatial order of: the first of the second ground pads, the first pair of differential signal interface pads, the second of the second ground pads, the third pair of differential signal interface pads, the third of the second ground pads, the second pair of differential signal interface pads, the fourth of the second ground pads, the fourth pair of differential signal interface pads, and the fifth of the second ground pads.

5. The optical module according to claim 1, wherein projections of centers of the respective second signal interface pads onto the first side do not coincide with each other.

6. The optical module according to claim 1, wherein each of the rows of the second signal interface pads is arranged parallel to the first side.

7. The optical module according to claim 1, wherein the respective second signal interface pads lie within two boundary lines which are extending lines of adjacent sides of the first side.

8. The optical module according to claim 1, wherein the respective second ground pads lie within two boundary lines which are extending lines of adjacent sides of the first side.

9. The optical module according to claim 1, wherein projections of the plurality of signal wires onto the chip are substantially perpendicular to the first side.

* * * * *